(12) United States Patent
Nakayama

(10) Patent No.: US 11,536,768 B2
(45) Date of Patent: Dec. 27, 2022

(54) INSPECTION APPARATUS

(71) Applicant: TOKYO ELECTRON LIMITED, Tokyo (JP)

(72) Inventor: Hiroyuki Nakayama, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/374,660

(22) Filed: Jul. 13, 2021

(65) Prior Publication Data

US 2022/0018898 A1 Jan. 20, 2022

(30) Foreign Application Priority Data

Jul. 14, 2020 (JP) .............................. JP2020-120860

(51) Int. Cl.
*G01R 1/44* (2006.01)
*G01R 31/308* (2006.01)
*G01R 1/073* (2006.01)

(52) U.S. Cl.
CPC ....... *G01R 31/308* (2013.01); *G01R 1/07307* (2013.01); *G01R 1/44* (2013.01)

(58) Field of Classification Search
CPC .. G01R 1/07307; G01R 1/07314; G01R 1/44; G01R 31/2874; G01R 31/2891; G01R 31/308; H01L 21/67115; H01L 22/14; H05B 3/0047; H05B 3/20
USPC .................................................. 324/754.23
See application file for complete search history.

(56) References Cited

U.S. PATENT DOCUMENTS 6,078,183 A 6/2000 Cole
2005/0287685 A1 12/2005 McFadden

FOREIGN PATENT DOCUMENTS

JP H0494733 U * 9/1992 ............. G01R 31/26
JP 2018-151369 A 9/2018

OTHER PUBLICATIONS

English Translation of JPH0494733 U (Year: 1992).*

* cited by examiner

*Primary Examiner* — Jermele M Hollington
*Assistant Examiner* — Courtney G McDonnough
(74) *Attorney, Agent, or Firm* — Fenwick & West LLP

(57) ABSTRACT

An inspection apparatus includes a stage on which a substrate is placed, a cooler, a probe card, a light irradiator and a controller. The cooler cools the substrate placed on the stage. The probe card has probes to be in contact with the substrate to supply electric power. The light irradiator irradiates light to an upper surface of the substrate, opposite to a bottom surface of the substrate placed on the stage. Further, the controller controls the light irradiator.

6 Claims, 4 Drawing Sheets

INSPECTION APPARATUS

CROSS-REFERENCE TO RELATED APPLICATIONS

This application claims priority to Japanese Patent Application No. 2020-120860, filed on Jul. 14, 2020, the entire contents of which are incorporated herein by reference.

TECHNICAL FIELD

The present disclosure relates to an inspection apparatus.

BACKGROUND

There is known an inspection apparatus in which a wafer or a carrier having electronic devices thereon is placed on a substrate support and electrical characteristics of the electronic devices are inspected by supplying a current from a tester to the electronic devices through probes or the like. Temperatures of the electronic devices are controlled by a cooler or a heater in the substrate support.

Japanese Patent Application Publication No. 2018-151369 discloses a substrate support including a cooler on which an inspection target is placed and a light irradiator disposed to face the inspection target via the cooler. The cooler is formed of a light transmitting material and allows a coolant capable of transmitting light to flow therethrough. The light irradiator has a plurality of light-emitting diodes (LEDs) oriented to the inspection target.

In Japanese Patent Application Publication No. 2018-151369, the temperature is controlled by irradiating light from the stage side on which the electronic devices are placed to cope with heat generated by the electronic devices under inspection. Further, when the temperatures of the electronic devices are adjusted, it is required to improve the responsiveness of the temperature control.

SUMMARY

In view of the above, the present disclosure provides an inspection device that improves responsiveness of temperature control of a substrate.

In accordance with an aspect of the present disclosure, there is provided an inspection apparatus including a stage on which a substrate is placed; a cooler to cool the substrate placed on the stage; a probe card having probes to be in contact with the substrate to supply electric power; a light irradiator to irradiate light to an upper surface of the substrate; and a controller to control the light irradiator.

BRIEF DESCRIPTION OF THE DRAWINGS

The objects and features of the present disclosure will become apparent from the following description of embodiments, given in conjunction with the accompanying drawings, in which:

FIG. 5 is an example of a schematic view of an LED array viewed from an irradiation surface side; and.

DETAILED DESCRIPTION

Figure 1:
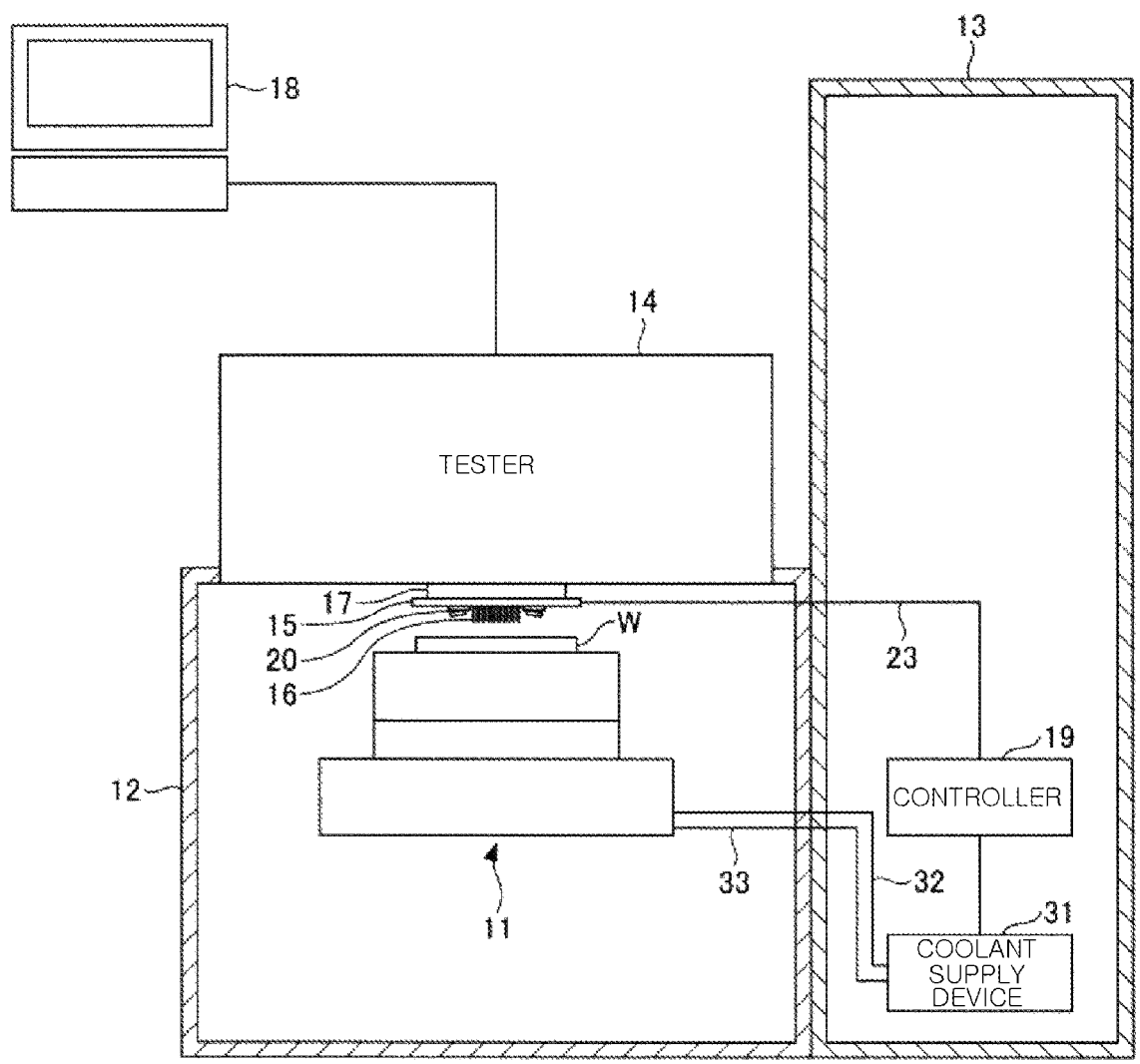
FIG. 1 is an example of a schematic cross-sectional view illustrating a configuration of an inspection apparatus according to an embodiment.

Hereinafter, embodiments will be described in detail with reference to the accompanying drawings. Like reference numerals will be given to like parts throughout the drawings, and redundant description thereof may be omitted.

<Inspection Apparatus>

An inspection apparatus 10 including a stage (substrate support) 11 according to an embodiment will be described with reference to FIG. 1. FIG. 1 is an example of a schematic cross-sectional view illustrating a configuration of the inspection apparatus 10 according to the embodiment.

The inspection apparatus 10 is configured to respectively inspect electrical characteristics of a plurality of electronic devices disposed on a wafer (inspection target) W. The inspection target is not limited to the wafer W, and includes a carrier, a glass substrate, a single chip, or the like having electronic devices thereon. The inspection apparatus 10 includes an accommodating chamber 12 accommodating a stage 11 on which the wafer W is placed, a loader 13 disposed adjacent to the accommodating chamber 12, and a tester 14 disposed to cover the accommodating chamber 12.

The accommodation chamber 12 has a hollow housing shape. In the accommodating chamber 12, the stage 11 on which the wafer W is placed and a probe card 15 disposed to face the stage 11 are accommodated. The probe card 15 has a plurality of needle-shaped probes (contact terminals) 16 arranged to correspond to solder bumps or electrode pads installed correspondingly to electrodes of each electronic device of the wafer W.

The stage 11 has a fixing mechanism (not shown) for fixing the wafer W to the stage 11. Accordingly, the displacement of the position of the wafer W with respect to the stage 11 is prevented. Further, a moving mechanism (not shown) for moving the stage 11 in a horizontal direction and a vertical direction is disposed in the accommodating chamber 12. Accordingly, the solder bumps or the electrodes pads installed correspondingly to electrodes of each electronic device are brought into contact with the probes 16 of the probe card 15 by adjusting a relative position between the probe card 15 and the wafer W.

The loader 13 is configured to extract a wafer W having the electronic devices thereon from a FOUP (not shown) that is a transfer container and places the wafer W on the stage 11 in the accommodating chamber 12. Further, the loader 13 is configured to remove an inspected wafer W from the stage 11 and accommodates the inspected wafer W in the FOUP.

The probe card 15 is connected to the tester 14 through an interface 17. When the probes 16 are brought into contact with the solder bumps or the electrode pads installed correspondingly to the electrodes of each electronic device of the wafer W, the probes 16 supply electric power from the tester 14 to the electronic device through the interface 17 or transmits signals from the electronic device to the tester 14 through the interface 17.

The tester 14 includes a test board (not shown) that emulates a part of a circuit configuration of a motherboard on which the electronic devices are installed. The test board is connected to a tester computer 18 that is configured to determine whether the electronic devices are defective or non-defective based on the signals from the electronic devices. In the tester 14, it is possible to emulate the circuit configurations of various types of motherboards by replacing the test board.

A controller 19 controls an operation of the stage 11. The controller 19 controls the moving mechanism (not shown) of the stage 11 to move the stage 11 in the horizontal direction and the vertical direction. Further, the controller 19 is connected to a light irradiator 20 through a wiring 23. The controller 19 controls an operation of the light irradiator 20 through the wiring 23, which will be described later.

A coolant supply device 31 is connected to a coolant channel 30 of the stage 11 through a supply pipe 32 and a return pipe 33, and the coolant can be circulated between the coolant supply device 31 and the coolant channel 30 of the stage 11. The controller 19 controls the coolant supply device 31 to control a temperature, a flow rate, or the like of the coolant that is supplied from the coolant supply device 31 to the coolant channel 30.

Although it is illustrated in FIG. 1 that the controller 19 and the coolant supply device 31 are disposed in the loader 13, the present disclosure is not limited thereto and the controller 19 and the coolant supply device 31 may be disposed at other portions.

In the inspection apparatus 10, when the electrical characteristics of the electronic devices are inspected, the tester computer 18 transmits data to the test board connected through the electronic devices and the probes 16. Then, the tester computer 18 determines whether or not the transmitted data has been correctly processed by the test board based on the electrical signals from the test board.

<Wafer Temperature Control Mechanism>

Figure 2:
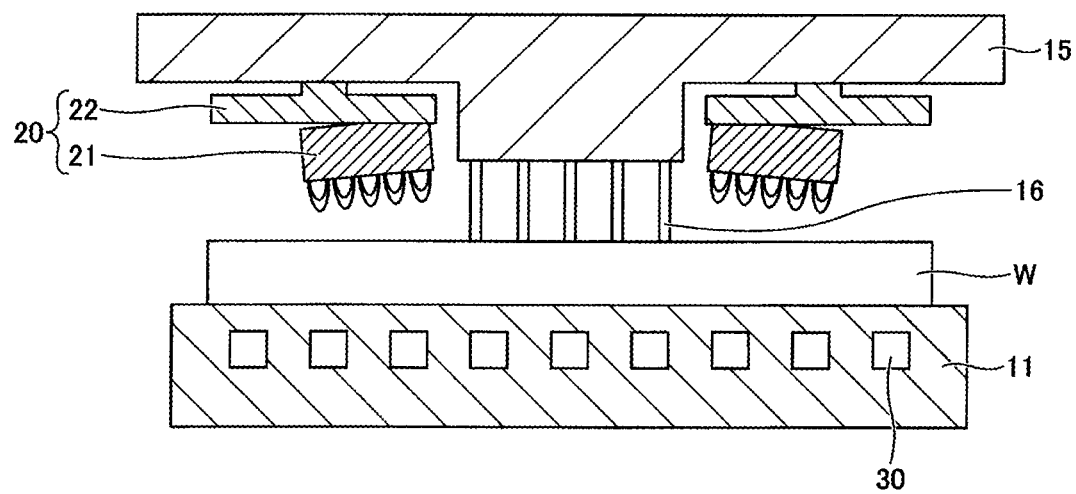
FIG. 2 is an example of a schematic cross-sectional view illustrating a wafer temperature control mechanism in the inspection apparatus according to the embodiment.

Next, a temperature control mechanism of the wafer W in the inspection apparatus 10 according to the embodiment will be described with reference to FIG. 2. FIG. 2 is an example of a schematic cross-sectional view illustrating the temperature adjusting mechanism of the wafer W in the inspection apparatus 10 according to the embodiment.

The wafer W on which electronic devices are formed is placed on the stage 11. The coolant channel (cooler) 30 is formed in the stage 11. The coolant is supplied from the coolant supply device 31 (see FIG. 1) to the coolant channel 30 through the supply pipe 32 (see FIG. 1). The coolant flowing through the coolant channel 30 is returned to the coolant supply device 31 through the return pipe 33 (see FIG. 1). The coolant may be, for example, Galden (Registered Trademark) or colorless liquid that allows light to pass therethrough such as water.

The probe card 15 has a light irradiator 20 that irradiates light to heat the electronic devices of the wafer W from right above the upper surface of the wafer W (the upper surface being opposite to the bottom surface of the wafer W placed on the stage). The light irradiator 20 includes an LED array 21 and an LED control board 22. The LED control board 22 controls the on/off of the LED array 21. Further, the LED array 21 is supported by the LED control board 22 while being inclined toward the electronic devices (electronic devices under inspection) to which the probes 16 are connected. Further, the LED array 21 is provided with a lens (not shown) for controlling directivity of LED light so that the LED light can be irradiated to the electronic devices under inspection. The LED control board 22 supports the LED array 21 and is suspended from the probe card 15. The LED control board 22 is connected to the controller 19 (see FIG. 1) through the wiring 23 (see FIG. 1).

Figure 3:
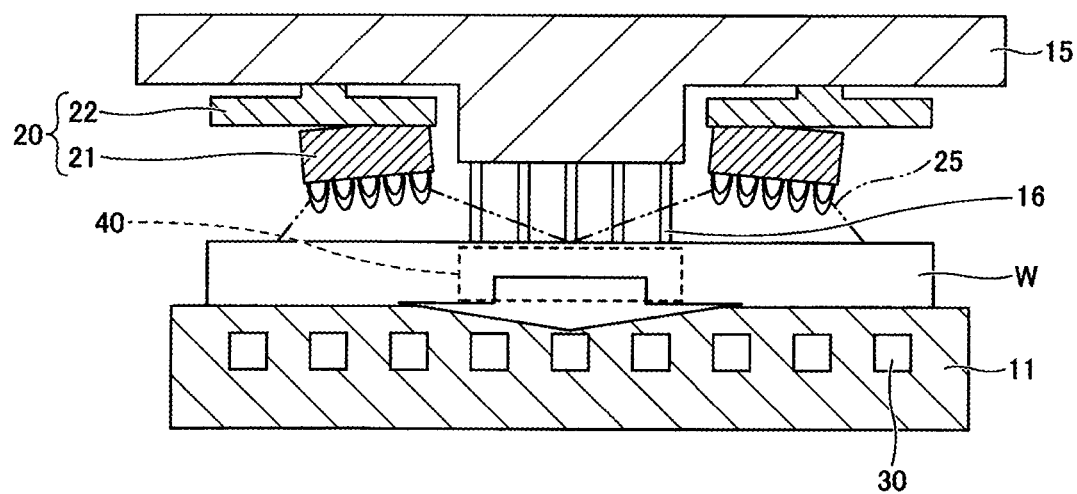
FIG. 3 is an example of a schematic cross-sectional view illustrating temperature control of a wafer in the inspection apparatus according to the embodiment.

FIG. 3 is an example of a schematic cross-sectional view illustrating the temperature adjustment of the wafer W in the inspection apparatus 10 according to the embodiment.

When the electronic devices are inspected, electric power is supplied from the tester 14 to the electronic devices of the wafer W through the probes 16. Accordingly, the electronic devices of the wafer W generate heat. In FIG. 3, such a region is illustrated as a heat generating region 40. Further, the controller 19 controls the light irradiator 20. In FIG. 3, light 25 emitted from the light irradiator 20 is indicated by a double dotted line. The light emitted from the light irradiator 20 is irradiated to the heat generating region 40 from right above the upper surface of the wafer W. Further, the coolant is supplied to the coolant channel 30. Accordingly, the heat of the heat generating region 40 is absorbed by the coolant in the coolant channel 30 through the stage 11 as indicated by a white arrow.

Figure 4:
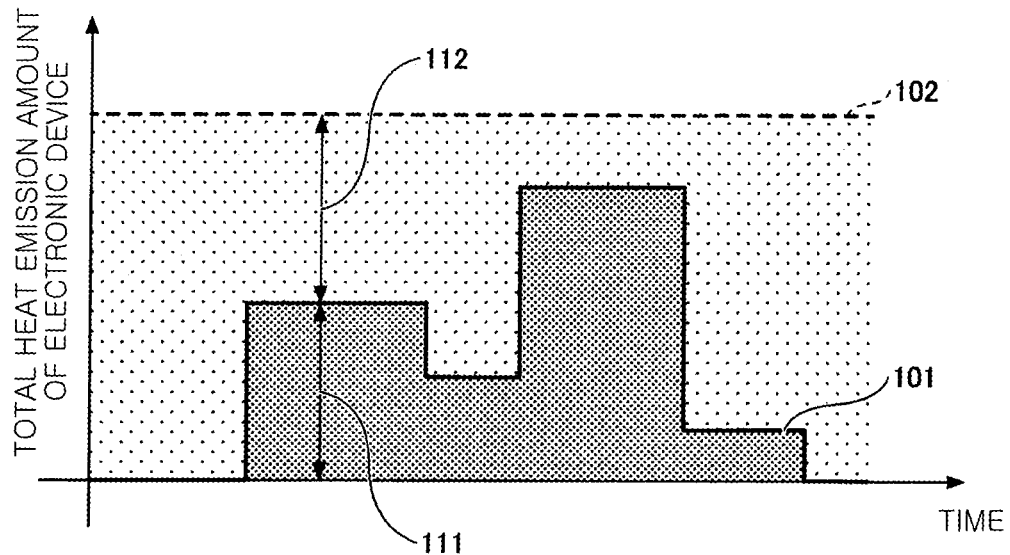
FIG. 4 is an example of a graph illustrating the amount of heat generated in a heat generation region of the wafer.

FIG. 4 is an example of a graph illustrating the amount of heat generated in the heat generating region 40 of the wafer W. In FIG. 4, the vertical axis represents a heat emission amount and the horizontal axis represents time. When the electronic devices are inspected, the electric power supplied from the probes 16 to the electronic devices of the wafer W changes depending on the inspection content. Therefore, a heat emission amount 101 of the electronic device itself changes with time.

The controller 19 controls the time-varying changes of the light amount of the light irradiator 20 depending on the time-varying changes of the heat emission amount 101 of the electronic device itself. Specifically, a total device heat emission amount 102 that is the sum of a heat emission amount 111 of the electronic device itself due to the electric power supply and a heat emission amount 112 due to the light irradiator 20 is controlled to be constant.

In the inspection apparatus 10 of the present embodiment, the electronic devices can be directly heated by irradiating the light from right above the upper surface of the wafer W. Accordingly, the responsiveness of the temperature control of the electronic devices can be improved.

Further, in the inspection apparatus 10 of the present embodiment, even when the heat emission amount of the electronic devices changes due to the change in the electric power supply during the inspection of the electronic devices, the total heat emission amount can be maintained at a constant level by controlling the heating amount of the electronic devices by the light irradiator 20. At this time, the coolant channel 30 is controlled to absorb a constant amount of heat. Accordingly, the temperatures of the electronic devices can be maintained at a constant level during the inspection of the electronic devices.

Further, due to the configuration in which the light irradiator 20 irradiates light from right above the upper surface of the wafer W, the degree of freedom in designing the coolant channel 30 in the stage 11 is improved. Accordingly, it is easy to assemble a high heat-absorbing cooler, such as a microchannel structure, a heat pipe structure, or the like.

Figure 5:
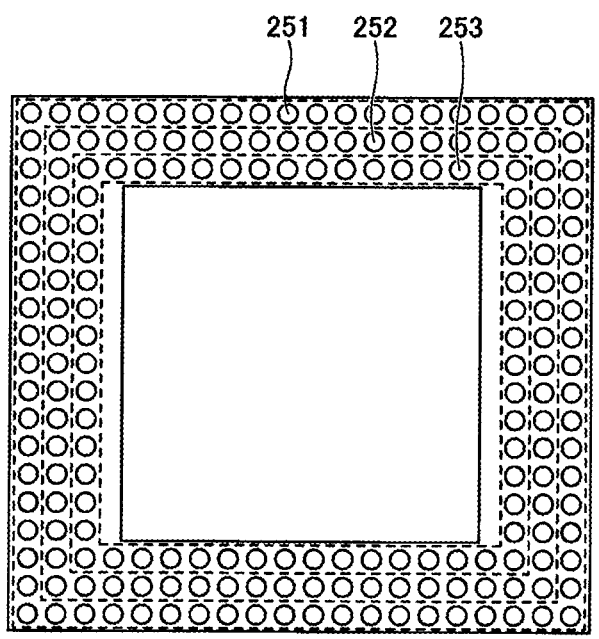

FIG. 5 is an example of a schematic view of the LED array 21 viewed from an irradiation surface side. The LED array 21 is disposed to surround the outer periphery of the probes 16 (see FIG. 2). The LED array 21 includes, e.g., an LED array group 251 that irradiates light to an outer peripheral side of an electronic device to be inspected, an LED array group 252 that irradiates light to an intermediate portion (between the outer peripheral portion and a central portion) of the electronic device to be inspected, and an LED array group 253 that illuminates light to the central portion (inner peripheral side) of the electronic device. The controller 19 can adjust the light amount distribution of the light irradiated to the wafer W by controlling the light amount of each LED depending on the arrangement position of the LEDs. For example, the controller 19 can control the light amount for each of the LED array groups 251 to 253. In other words, the controller 19 is configured to control the light amount distribution of the light irradiator 20 that irradiates light to the electronic devices. In FIG. 5, it is illustrated that the LED array 21 is arranged in three rows from the central portion toward the outer peripheral side. However, the present disclosure is not limited thereto. Further, although the case where the light amount is controlled for each of the three LED array groups has been described, the arrangement of the LED array groups is not limited thereto.

When the electronic device is inspected, the electronic device generates heat due to an output supplied from the probes 16. In this specification, heat of an outer peripheral portion of a chip of the electronic device is dissipated to its neighboring portions. On the other hand, a heat is stored in a central portion of the chip of the electronic device. Therefore, non-uniform heat distribution (temperature distribution) occurs in the electronic device.

Figure 6:
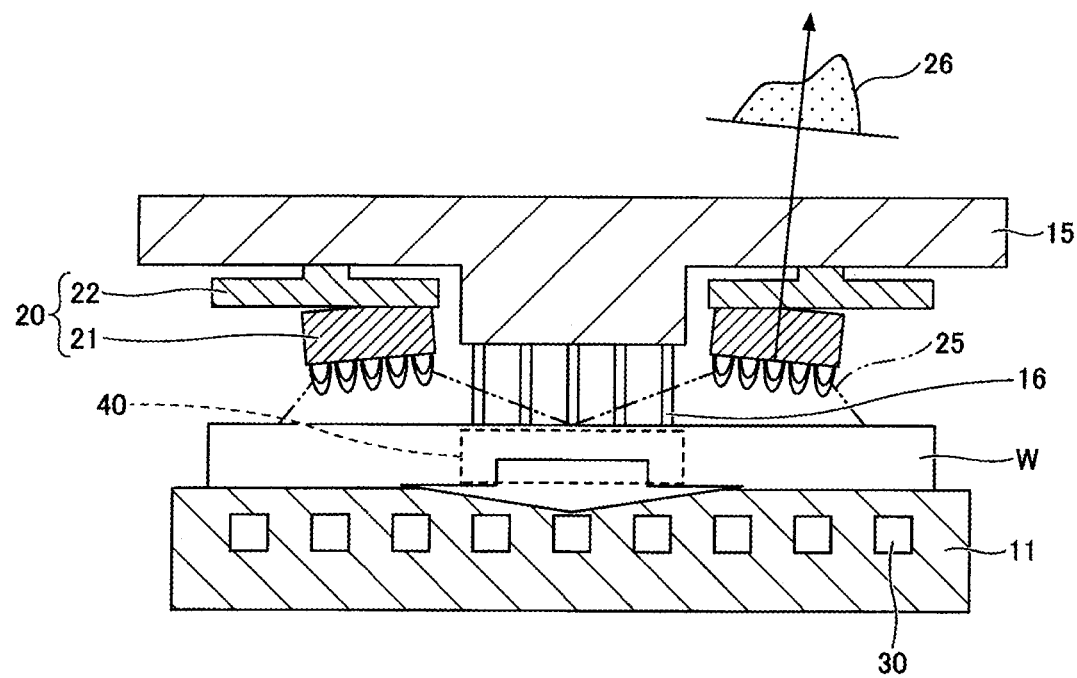
FIG. 6 is an example of a schematic cross-sectional view illustrating the temperature control of the wafer in the inspection apparatus according to the embodiment.

FIG. 6 is an example of a schematic cross-sectional view illustrating the temperature adjustment of the wafer W in the inspection apparatus 10 according to the embodiment.

The controller 19 controls light amount distribution 26 of the light irradiator 20 based on the heat distribution of the electronic device. FIG. 6 schematically shows the light amount distribution 26 of the light irradiator 20. For example, the light amount of the LED array group 251 that irradiates light to the outer peripheral side of the electronic device is controlled to be stronger than the light amount of the LED array group 253 that irradiates light to the inner peripheral side of the electronic device. Accordingly, the heat distribution on the surface of the electronic device can become uniform.

While the inspection apparatus 10 has been described above, the present disclosure is not limited to the above-described embodiments, and various changes and modifications can be made without departing from the scope of the appended claims and the gist thereof.

The inspected object of the inspection apparatus 10 has been described by taking a wafer W on which a plurality of electronic devices are formed as an example, but the present invention is not limited thereto. The object to be inspected by the inspection apparatus 10 may be a carrier C in which a plurality of electronic devices are arranged.

Although the light irradiator 20 using the LEDs as a light source has been described, the light source is not limited thereto, and may be a lamp or the like.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes to the embodiments described herein may be made without departing from the spirit of the disclosures. The accompanying claims and their equivalents are intended to cover such forms or modifications as would fall within the scope and spirit of the disclosures.

What is claimed is:

1. An inspection apparatus comprising:
a stage on which a substrate is placed;
a cooler to cool the substrate placed on the stage;
a probe card having probes to be in contact with the substrate to supply electric power;
a light irradiator to irradiate light to an upper surface of the substrate, opposite to a bottom surface of the substrate placed on the stage; and
a controller to control the light irradiator,
wherein the light irradiator includes multiple light sources, and the light sources are arranged in multiple rows in a radial direction at outer peripheries of the probes, and
wherein the controller controls the light amount of each of the light sources by dividing the light sources arranged in the multiple rows into an inner peripheral side light source group and an outer peripheral side light source group, and controls the light amount distribution of the light irradiator.

2. The inspection apparatus of claim 1, wherein the controller controls the light amount of the light irradiator based on a heat emission amount of the substrate due to the electric power supply.

3. The inspection apparatus of claim 2, wherein the controller controls time-varying changes of the light amount of the light irradiator based on time-varying changes of the heat emission amount of the substrate due to the electric power supply.

4. The inspection apparatus of claim 3, wherein the controller controls the light amount of the light irradiator or the time-varying changes of the light amount of the light irradiation amount based on the sum of the heat emission amount of the substrate due to the electric power supply and the heat emission amount of the substrate due to the light irradiated by the light irradiator.

5. The inspection apparatus of claim 1, wherein the controller controls light amount distribution of the light irradiator based on heat distribution of the substrate.

6. The inspection apparatus of claim 5, wherein the substrate has a device to which the electric power from the probes is supplied, and
the controller controls the light amount distribution of the light irradiator such that the amount of light irradiated to an outer peripheral portion of the device becomes greater than the amount of light irradiated to an inner peripheral portion of the device.

* * * * *